United States Patent [19]

Cook

[11] Patent Number: 5,717,338
[45] Date of Patent: Feb. 10, 1998

[54] METHOD AND APPARATUS FOR TESTING TELEVISION YOKES AND FLYBACK TRANSFORMERS

[75] Inventor: Terry D. Cook, Sioux Falls, S. Dak.

[73] Assignee: Sencore, Inc., Sioux Falls, S. Dak.

[21] Appl. No.: 554,768

[22] Filed: Nov. 7, 1995

[51] Int. Cl.⁶ ............................. G01R 31/02; G01R 31/06
[52] U.S. Cl. ..................... 324/546; 324/547; 340/646
[58] Field of Search ........................... 324/388, 546, 324/547, 726; 340/646

[56] References Cited

U.S. PATENT DOCUMENTS

| | | | |
|---|---|---|---|
| 2,249,157 | 7/1941 | Morgan et al. | 324/546 |
| 3,354,387 | 11/1967 | Whaley et al. | 324/546 |
| 3,508,143 | 4/1970 | Kuroda | 324/546 |
| 3,887,866 | 6/1975 | Safer et al. | 324/546 |
| 3,934,194 | 1/1976 | Paprocki | 324/547 |
| 3,990,002 | 11/1976 | Baum | 324/546 |
| 4,547,723 | 10/1985 | McLellan | 324/547 X |

Primary Examiner—Kenneth A. Wieder
Assistant Examiner—Diep Do
Attorney, Agent, or Firm—Patnaude, Videbeck & Marsh

[57] ABSTRACT

A method and apparatus for testing flyback transformers counts the number of cycles of a decaying ringing signal generated in a resonant circuit including the secondary winding of the flyback transformer beginning with the second cycle and ending with the cycle where the amplitude of the ringing signal falls below twenty-five percent of the amplitude of the second cycle of the ringing signal.

6 Claims, 3 Drawing Sheets

METHOD AND APPARATUS FOR TESTING TELEVISION YOKES AND FLYBACK TRANSFORMERS

The present invention relates in general to the art of testing inductance coils, such as the yokes and flyback transformers used in television sets, and in particularly it relates to an improvement of the invention described in U.S. Pat. No. 3,990,002 issued Nov. 2, 1976.

BACKGROUND OF THE INVENTION

The method and circuit described in the above-identified patent has facilitated the testing of the yokes and flyback transformers of solid state television receivers in a simple and reliable manner. In this prior art method, a ringing cycle is initiated by an initializing pulse applied to the device under test and a capacitor connected in parallel therewith, and the number of cycles between the initializing pulse and the cycle when the voltage level has decayed to a predetermined value is counted to determine if the transformer is defective. In a commercial embodiment of that invention, if ten or more cycles are thus counted, it is known that the flyback transformer under test is good. If the number of ringing cycles counted is less than ten, the flyback transformer under test is likely to be defective.

It has been found that the circuit described in the said patent has not functioned properly with some of the newer types of flyback transformers which incorporate internal rectification and filtering circuitry or the like connected across one or more of the secondary windings of the transformers. This is because the capacitors in such circuitry clip or dampen the ringing sine wave such that the voltage level at which the count is terminated is often reached in about three cycles of the ringing signal. As a result, good flyback transformers having internal filters and rectifiers connected across the windings of the transformers may cause the test circuit to indicate that the transformers are faulty because the test does not distinguish the fact that the ringing sine wave has been dampened by such internal capacitance and resistance and thus decays to the predetermined voltage level before a non-dampened ringing sine wave would have decayed to that same voltage level. Since the filters and the rectifiers are contained within an enclosed casing along with the windings of the transformers, they cannot be conveniently disconnected from the windings in order to conduct a test of the coils themselves. Consequently, there is a need for a method and circuit to test the types of yokes and flyback transformers having internal circuitry such as rectifiers, filters, and the like connected across the windings of the transformers as well as the types of yokes and flyback transformers which do not have any circuitry connected across the windings thereof.

SUMMARY OF THE INVENTION

Briefly, there is provided in accordance with the teachings of the present invention a novel instrument and method for testing inductance coils such as the yokes and flyback transformers used in television systems including those which incorporate internal rectifiers, filters and other circuitry which dampens the ringing sine wave established therein. It is important that this test function with both the older and newer types of flyback transformers and that it can be carried out without isolating the inductance coils from the rectifiers and the other internal circuitry and without first determining if the flyback transformer under test does indeed incorporate internal circuitry which will dampen the ringing sine wave. The instrument and method of the present invention employs a variable threshold circuit which measures the peak amplitude of a cycle of the ringing sine wave subsequent to the initializing pulse and then sets a voltage level at a percentage of the peak voltage level thus measured at which the count of the cycles of the ringing sine wave is terminated. Also, in this new method the initial cycle of the ringing sine wave is not counted, but the count begins only with a subsequent ringing cycle, such, for example, as the second cycle. In the preferred embodiment of the invention described hereinafter, the count is initiated with the second cycle of the ringing wave and the voltage at which the count is terminated is set at twenty-five percent of the level of the peak value of the second cycle of the ringing sine wave. Although the voltage level at which the count is terminated is not critical, it has been found that a voltage level of twenty-five percent of the second pulse successfully detects all defective flyback transformers of the type used in television picture tubes and other cathode ray tubes without indicating good transformers to be defective.

BRIEF DESCRIPTION OF THE DRAWINGS

Further objects and advantages and a better understanding of the present invention may be had from a reading of the following detailed description taken in connection with the drawings wherein.

DETAILED DESCRIPTION OF THE INVENTION

Figure 1:
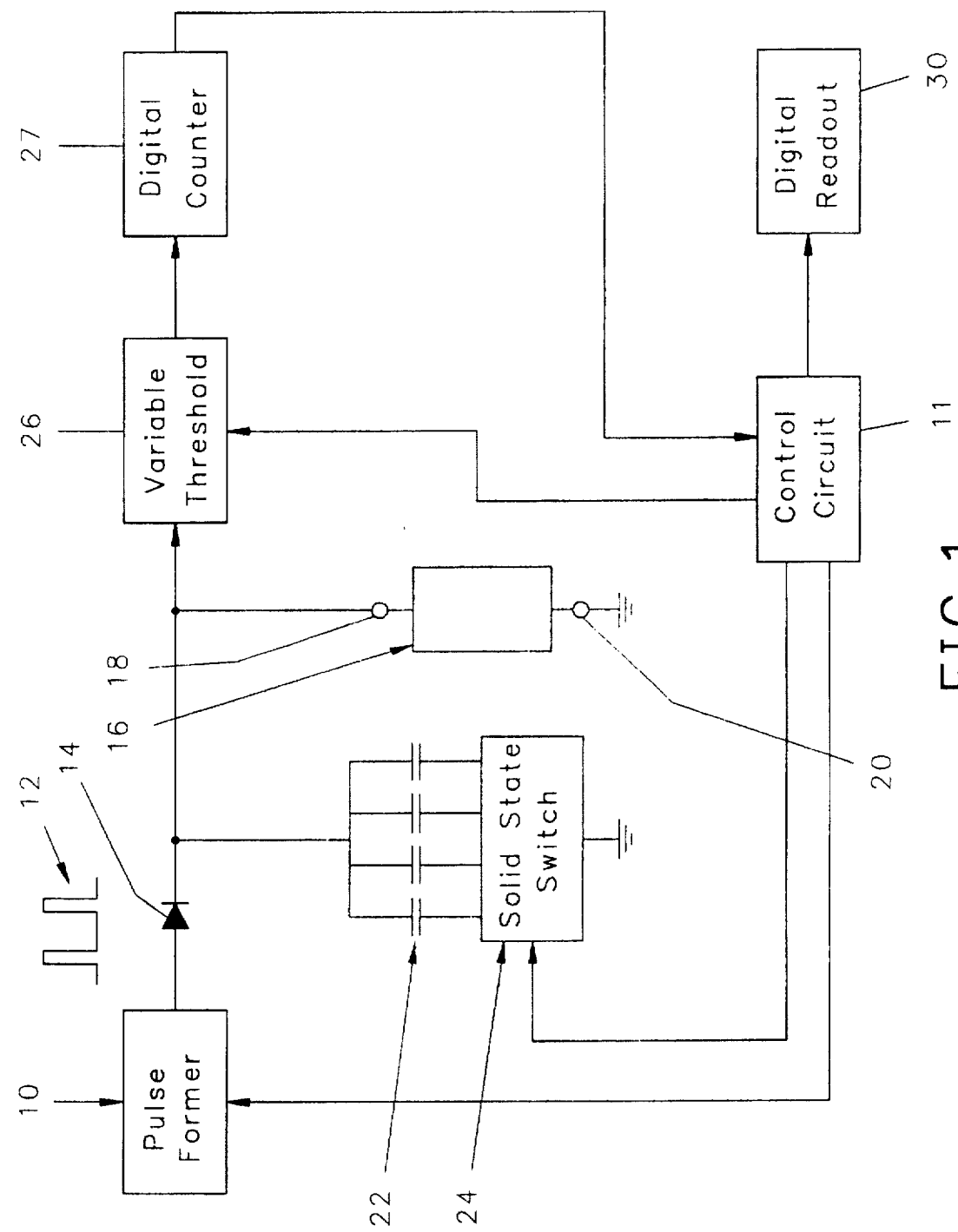
FIG. 1 is a block diagram of a test instrument embodying the present invention, which instrument is shown to include a variable threshold circuit for setting the voltage level at which the count of the ringing cycles is terminated.
Figure 2:
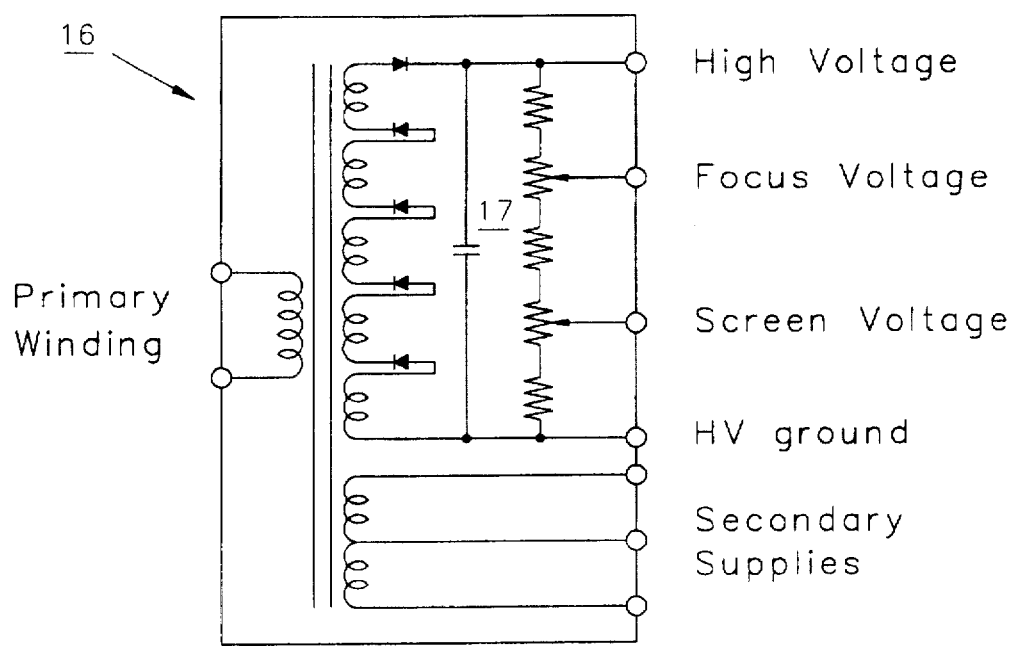
FIG. 2 is a schematic circuit diagram of a typical flyback transformer which incorporates an integrated high voltage multiplier and an RC filter circuit connected across the high voltage secondary windings of the transformer.

Referring to FIG. 1, a pulse former 10 is supplied with an initialization signal from a control circuit 11 and produces a train of narrow voltage pulses 12. The pulses 12 are fed through a blocking diode 14 and applied across a transformer 16 or other inductance device under test. A typical flyback transformer which may be under test is shown in FIG. 2 and will be seen to incorporate an RC filter circuit 17 connected across several of the secondary windings of the flyback transformer and across a plurality of serially connected resistors providing a plurality of high voltage outputs used in the associated television system.

As shown in FIG. 1, the flyback transformer 16 is connected between a pair of test terminals 18 and 20, and as may be seen, the test terminal 18 is connected to the diode 14 and the test terminal 20 is connected to ground. The pulses from the blocking diode 14 are also applied across a plurality of capacitors 22 and a switching device 24. The switching device 24 is preferably a transistorized solid state switch which functions to selectively connect the capacitors 22 to ground thereby to cause the coil 16 under test to ring each time that its inductance is such that it resonates with the selected one or more of the capacitors 22. As a consequence, the ringing signal, which consists of a decaying sine wave as illustrated, for example, in FIG. 4A, is developed across the device 16 under test, assuming that the device 16 includes the internal circuitry heretofore described wherefor the initializing pulse and thus the level of the first cycle of the ringing sine wave is appreciably greater than the level of the second cycle. As explained hereinabove the rate of decay is greater when the device under test incorporates an RC filter circuit than would otherwise be the case. This decaying ringing signal is coupled to a variable threshold device 26 shown in greater detail in FIG. 3 and described in connection therewith. The output from the variable threshold device 26 is a train of voltage pulses which are applied to a digital counter 27 whose output is applied to the control circuit 11 which drives a digital readout device 30. As shown in the drawing, the control circuit 11 also drives the pulse former 10 and the switch 24 in the manner more fully described hereinafter.

Figure 3:
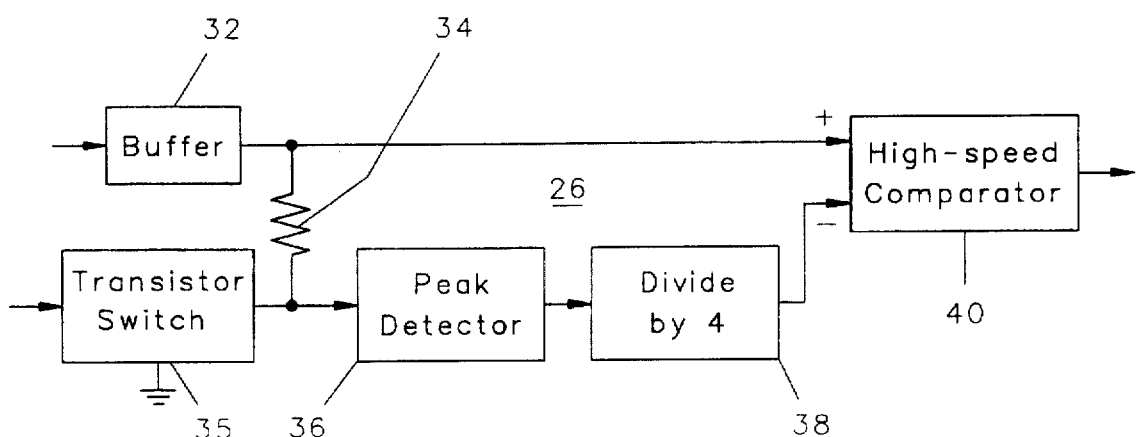
FIG. 3 is a block diagram of a variable threshold circuit suitable for incorporation in the test instrument illustrated in FIG. 1.
Figure 4:
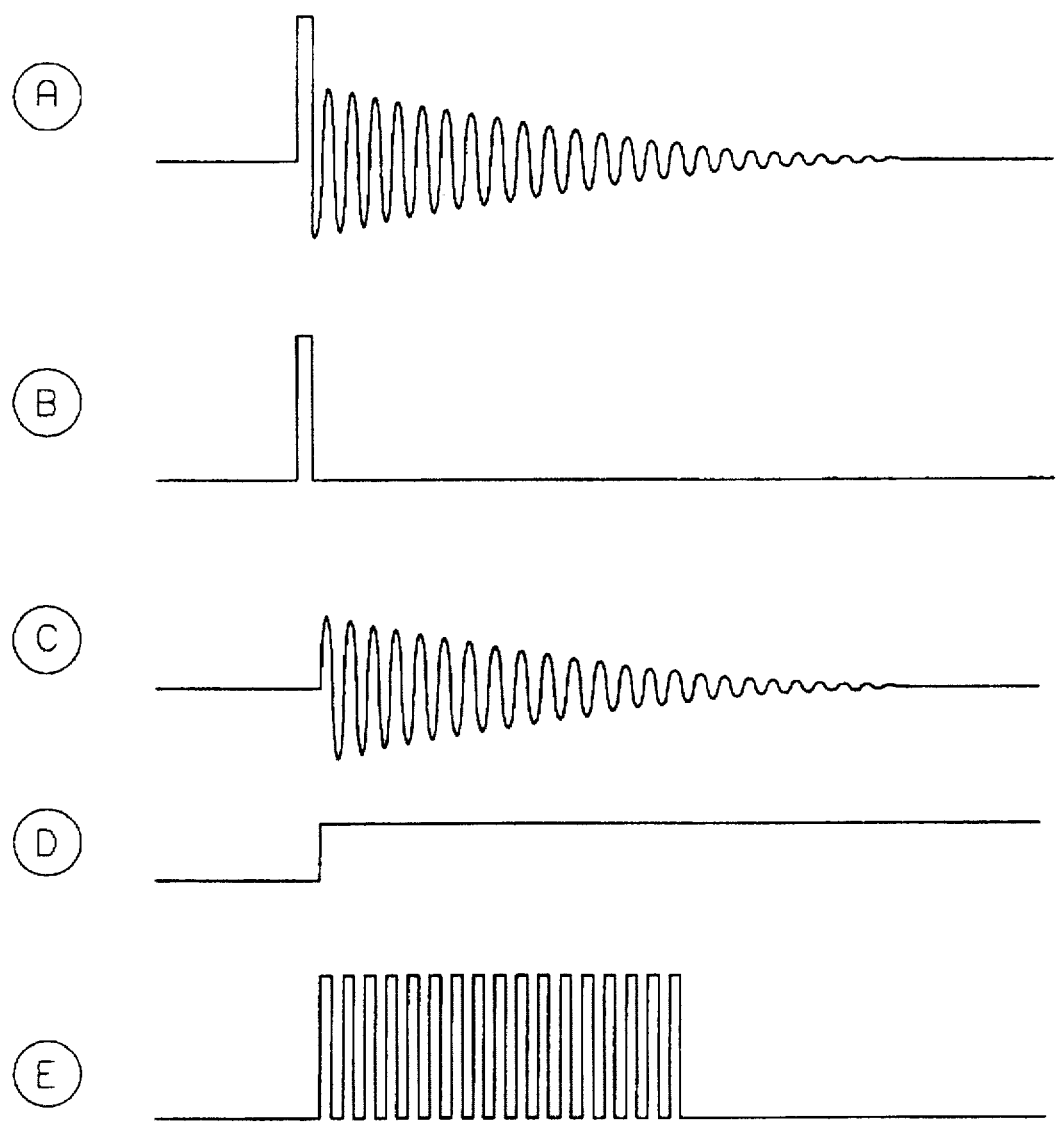
FIGS. 4 illustrate a plurality of waveforms (A-E) useful in understanding the operation of the circuits shown in FIGS. 1, 2, and 3.

Referring to FIG. 3, the threshold circuit 26 may be seen to include a buffer 32 which provides a high impedance across the device 16 under test to permit signal conditioning on the output side thereof without affecting the ringing signal. The output from the buffer is identical to the input thereto from the device 16 and where a flyback transformer is under test it will have the waveform shown in FIG. 4a. The output of the buffer 32 is applied through a resistor 34 to a switch 35 which connects the input of a peak detector to ground except for a brief time when one of the capacitors 22 is connected across the device 16 under test. FIG. 4b illustrates the waveform which appears at the input of the peak detector 36 each time a capacitor 22 which resonates with the device 16 is first connected across the device 16. It will be seen that the signal shown in FIG. 4c is similar to the signal applied to the buffer 32 and shown in FIG. 4a except that the initial cycle of the ring signal has been omitted.

The peak detector 36 measures the peak voltage level of the ringing sine wave applied thereto and applies that peak level to a voltage divider 38 which divides the input level by four, whereby the output level is twenty-five percent of the peak level of the ringing sine wave beginning with the second cycle thereof. The output of the peak detector 36 will be the level of the first cycle of the sine wave applied thereto, i.e. the signal shown in FIG. 4c, and the output signal from the peak detector 36 will be that shown in FIG. 4d. The output from the divider 38, which is thus of the same shape as the signal from the peak detector 36 but at a level of twenty-five percent of the amplitude thereof, is applied to the negative input of a high speed comparator 40 while the output from the buffer 32 is applied to the positive input of the comparator 40. Whenever the level of the ringing signal applied to the comparator 40 from the buffer exceeds the voltage level applied to the comparator 40 from the voltage divider 38, a signal appears at the output of the comparator 40. Since the input to the comparator 40 from the buffer is a sine wave, the output from the comparator 40 is a series of voltage pulses which respectively occur on the positive half cycles of the ringing sine wave. When the peak voltage level of the signal from the buffer 32 falls below the level of the voltage applied to the comparator 40 from the voltage divider 38, the output from the comparator goes low and remains at that level. Hence, it will be seen that the counter 27 is supplied with a train of pulses equaling the number of cycles of the ringing sine wave which occur between the second cycle and that cycle where the level of the ringing signal falls below twenty-five percent of the peak voltage level of the second cycle of the ringing sine wave. This waveform is shown in FIG. 4e. The number of cycles counted is applied to the digital readout device 30 through the control circuit 11 so that the number of cycles thus counted is displayed to the technician performing the test.

I have found that when the number of cycles counted by the above-described circuit is less than ten, a flyback transformer under test is defective, while a count of ten or more indicates a good flyback transformer. Of course, the percentage of twenty-five and the count of ten are not critical, but they do provide a convenient way of designing a circuit to carry out the test method of the present invention. If, for example, a lower percentage were to be used, the number of cycles indicative of a good flyback transformer would be less.

The control circuit 11 resets the peak voltage detector 36 and the digital counter 27 each time that it disconnects one of the capacitors 22 from the device 16 under test and connects another one of the capacitors thereto.

While the present invention has been described in connection with a particular embodiment thereof, it will be understood that many changes may be made therein without departing from the true spirit and scope of the invention. Therefore, it is intended by the appended claims to cover all such changes and modifications which fall within the true spirit and scope of the invention.

What is claimed:

1. An instrument for testing the yokes and flyback transformers of television picture tubes, comprising in combination a plurality of capacitors having different values of capacitance, means for selectively connecting said capacitors in parallel with the coil of a yoke or flyback transformer, a source of a train of voltage pulses, means for connecting said source of voltage pulses to said coil to cause said coil to ring and produce a dampened sine wave of voltage thereacross, measuring means for measuring the amplitude of one cycle of said sine wave which occurs subsequent to the initial cycle thereof, counting means for counting the number of cycles of said sine wave which occurs between said one cycle and a subsequent cycle when the amplitude of said sine wave is less than a predetermined amplitude value, means responsive to said measuring means for setting said predetermined amplitude value at a percentage of the amplitude of said one cycle, and means responsive to said counting means and the number of cycles counted thereby for indicating whether said number of cycles counted by said counting means is less than a predetermined value thereby indicting a defective device under test.

2. A test instrument according to claim 1, wherein said counting means initiates counting with said one cycle of of said sine wave.

3. A test instrument according to claim 2 wherein said one cycle of said sine wave is the first cycle following the initial cycle of said sine wave.

4. A test instrument according to claim 1, wherein said predetermined percentage is about twenty-five percent of said amplitude of said one cycle of said sine wave.

5. In a method of testing an inductance device, comprising the steps of:

causing said inductance to ring to produce a sine wave, counting the number of cycles of said sine wave which occur between a first cycle subsequent to the initial cycle of said sine wave and a second cycle when the level of said sine wave falls below a predetermined percentage of the level of said first cycle thereby indicating a defecting device under test if the number of cycles counted is less than predetermined value.

6. A method according to claim 5 wherein said step of counting is carried by measuring the peak voltage level of said sine wave during said first cycle, and comparing said sine wave to said predetermined percentage of of said peak voltage level.

* * * * *